(12) United States Patent
Liu et al.

(10) Patent No.: US 11,515,844 B2
(45) Date of Patent: Nov. 29, 2022

(54) LINEAR COMPENSATION METHOD AND APPARATUS FOR RADIO FREQUENCY AMPLIFIER AND MAGNETIC RESONANCE IMAGING SYSTEM

(71) Applicant: GE Precision Healthcare LLC, Wauwatosa, WI (US)

(72) Inventors: Yu Liu, Beijing (CN); Xin Xie, Beijing (CN); Hong Gu, Beijing (CN); Zhaoyi Zhou, Beijing (CN); Kai Wang, Beijing (CN); Haoyang Xing, Beijing (CN); Xianchao Wu, Beijing (CN); Dongliang Yang, Beijing (CN); Chunlai Xiao, Beijing (CN); Tingting Song, Beijing (CN); Jianye Ning, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 131 days.

(21) Appl. No.: 17/221,225

(22) Filed: Apr. 2, 2021

(65) Prior Publication Data
US 2021/0320627 A1 Oct. 14, 2021

(30) Foreign Application Priority Data
Apr. 14, 2020 (CN) .......................... 202010289751.5

(51) Int. Cl.
*H03F 1/30* (2006.01)
*G01R 33/36* (2006.01)
*H03F 3/19* (2006.01)

(52) U.S. Cl.
CPC ............ *H03F 1/30* (2013.01); *G01R 33/3614* (2013.01); *H03F 3/19* (2013.01); *H03F 2200/451* (2013.01)

(58) Field of Classification Search
CPC ........ H03F 1/30; H03F 3/19; H03F 2200/451; H03F 3/24; G01R 33/3614; G01R 33/0029; G01R 33/0041; G01R 33/443; G01R 33/48; A61B 5/055
See application file for complete search history.

(56) References Cited

U.S. PATENT DOCUMENTS

| 7,053,700 | B2 | 5/2006 | Smiley |
| 10,148,231 | B2 | 12/2018 | Hussein |
| 2021/0025953 | A1* | 1/2021 | Liu ................... G01R 33/3621 |

* cited by examiner

*Primary Examiner* — Susan S Lee

(57) ABSTRACT

Provided in the present invention are a linear compensation method for a radio frequency amplifier and a magnetic resonance imaging system. The linear compensation method for a radio frequency amplifier includes determining a working voltage of the radio frequency amplifier, determining a corresponding linear compensation value based on the working voltage, and performing linear compensation on the radio frequency amplifier based on the linear compensation value.

29 Claims, 13 Drawing Sheets

LINEAR COMPENSATION METHOD AND APPARATUS FOR RADIO FREQUENCY AMPLIFIER AND MAGNETIC RESONANCE IMAGING SYSTEM

CROSS-REFERENCE TO RELATED APPLICATIONS

This application claims priority pursuant to 35 U.S.C. 119(a) of China Patent Application No. 202010289751.5, filed Apr. 14, 2020, which application is incorporated herein by reference in its entirety.

FIELD OF THE INVENTION

The present invention relates to a medical imaging technique, in particular to a linear compensation method and apparatus for a radio frequency amplifier of a magnetic resonance imaging system, and a magnetic resonance imaging system.

BACKGROUND OF THE INVENTION

Magnetic resonance imaging (MRI), as a medical imaging modality, can obtain images of the human body without using X-rays or other ionizing radiation. MRI uses a magnet having a strong magnetic field to generate a static magnetic field B0. When a to-be-imaged part of the human body is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the part to be imaged can be reconstructed based on the acquired signal. A gradient system is configured to transmit a layer selection gradient pulse, a phase-coded gradient pulse, and a frequency-coded gradient pulse (also referred to as a read-out gradient pulse) to provide three-dimensional position information for the aforementioned magnetic resonance signal to implement image reconstruction.

Generally, as shown in FIG. 2, a radio frequency transmit link of magnetic resonance imaging includes a frequency synthesizer 210, a radio frequency amplifier 220, a T/R switch 230, and a radio frequency coil 240. The radio frequency coil includes a body coil and a local coil. The linearity (also referred to as fidelity) of the radio frequency transmit link is an important factor that affects the resolution of magnetic resonance imaging. The linearity directly affects the quality of layer selection during operation. As the frequency synthesizer 210 in the radio frequency transmit link is configured to generate a relatively small radio frequency signal and the T/R switch 230 is a passive component, therefore, in the radio frequency transmit link, the radio frequency amplifier 220 configured to amplify a signal has the greatest impact on linearity.

The radio frequency amplifier generally includes class A, class B, class C, and the like. Class A radio frequency amplifier has relatively good linearity but relatively poor efficiency. Class B radio frequency amplifier has relatively poor linearity but relatively good efficiency compared with class A radio frequency amplifier. Generally, to achieve better linearity and high efficiency, the radio frequency amplifier is designed to be between class A and class B. Therefore, to achieve better linearity of the radio frequency transmit link, the efficiency is accordingly low, and many problems may be caused.

First, because the power of the radio frequency amplifier is particularly high, for example, 10 kw, if the efficiency is relatively low, a lot of power is wasted due to heating, which causes not only a high requirement for a power supply, but also a high requirement for heat dissipation or cooling. The efficiency of the radio frequency amplifier is low for several reasons as follows.

In one aspect, FIG. 3 shows a trend in which the efficiency of a radio frequency amplifier changes with the output power. The horizontal coordinates are the output power (in the unit of dBm), and the vertical coordinates are the efficiency (in the unit of %). Apparently, as the output power increases, the efficiency increases gradually. However, the nominal power (or full power) of a body coil is 10 kw (equal to 70 dBm), and the nominal power of a local coil is 2 kw (equal to 63 dBm). It can be seen from FIG. 3 that the efficiency corresponding to 70 dBm is about 60%, and the efficiency corresponding to 63 dBm is only about 24%. In other words, even if both the body coil and the local coil work at the nominal power, the efficiency of supply to a radio frequency amplifier of the local coil is too low, which means that too much power is wasted due to heating.

In another aspect, FIG. 4 shows the use frequency distribution of transmit power of a radio frequency coil. The horizontal coordinates are transmit gains (TGs). The TG is an amount for controlling the transmit power level, and when TG=200, the power is the nominal power. The vertical coordinates are the use frequencies. Apparently, the transmit power of the radio frequency coil is not always the nominal power. In other words, the output power of the radio frequency amplifier is not always the nominal power. It can be seen from FIG. 4 that the TGs are mostly between 100 and 200. Therefore, the efficiency of the radio frequency amplifier that does not work at the nominal power is relatively low.

FIG. 5 shows a trend in which the efficiency of a radio frequency amplifier at different working voltages changes with the output power, where the horizontal coordinates are the output power, and the vertical coordinates are the efficiency. It can be seen from FIG. 5 that, when the working voltage is 165 V, the efficiency is 60% when the output power is 70 dBm (point m7), and the efficiency is 29.8% when the output power is 63 dBm (point m9). However, when the working voltage is 70 V, the efficiency is 54% when the output power is 63 dBm (point m10), that is, at the same output power, the frequency can be increased by improving the working voltage of the radio frequency amplifier. However, in an actual operation process, when the working voltage is changed, a gain characteristic (or an amplification factor) of the radio frequency amplifier also changes, and the output power also correspondingly changes. Therefore, when the efficiency of the radio frequency amplifier is increased by improving the working voltage, linear compensation needs to be performed on the radio frequency amplifier, so as to ensure the linearity of the radio frequency amplifier.

SUMMARY OF THE INVENTION

Provided in the present invention are a linear compensation method and apparatus for a radio frequency amplifier of a magnetic resonance imaging system, and a magnetic resonance imaging system.

An exemplary embodiment of the present invention provides a linear compensation method for a radio frequency amplifier of a magnetic resonance imaging system, wherein the linear compensation method comprises: determining a working voltage of the radio frequency amplifier, determining a corresponding linear compensation value based on the working voltage, and performing linear compensation on the radio frequency amplifier based on the linear compensation value.

Specifically, the determining a working voltage of the radio frequency amplifier comprises: obtaining a current radio frequency field strength of the magnetic resonance imaging system; and obtaining the working voltage of the radio frequency amplifier based on the radio frequency field strength and a characteristic of the radio frequency amplifier. Further, the characteristic of the radio frequency amplifier comprises a characteristic in which a gain and a phase of the radio frequency amplifier change with an output power. Further, the obtaining a current radio frequency field strength of the magnetic resonance imaging system comprises estimating the radio frequency field strength based on a set scanning parameter.

Specifically, the linear compensation method further comprises controlling a supply voltage of the radio frequency amplifier based on the working voltage.

Specifically, the determining a corresponding linear compensation value based on the working voltage comprises selecting a linear compensation value corresponding to the working voltage from a lookup table based on the working voltage.

Further, the selecting a linear compensation value corresponding to the working voltage from a lookup table comprises selecting the linear compensation value from a preset lookup table corresponding to a constant load.

Still further, the determining a corresponding linear compensation value based on the working voltage further comprises optimizing the preset lookup table to form a real-time optimized lookup table corresponding to a real-time load, and the selecting a linear compensation value corresponding to the working voltage from a lookup table comprises selecting the linear compensation value from the real-time optimized lookup table.

Still further, the determining a corresponding linear compensation value based on the working voltage further comprises selecting a lookup table from the preset lookup table and the real-time optimized lookup table based on an application scenario of the magnetic resonance imaging system, so as to perform linear compensation value.

Still further, the optimizing the preset lookup table comprises: obtaining a linear open-loop characteristic of the radio frequency amplifier corresponding to a current load; and modifying the preset lookup table based on the linear open-loop characteristic to form the real-time optimized lookup table. Further, the linear open-loop characteristic comprises being obtained based on a training pulse inputted to the radio frequency amplifier.

Still further, the determining a corresponding linear compensation value based on the working voltage further comprises sorting the real-time optimized lookup tables used for a plurality of scans within a predetermined time period and selecting at least one lookup table based on the sorting result as a commonly used lookup table. Further, the selecting a linear compensation value corresponding to the working voltage from a lookup table comprises selecting the linear compensation value from the real-time optimized lookup table or the commonly used lookup table based on whether the working voltage and the radio frequency field strength have a corresponding linear compensation value in the commonly used lookup table. Further, if the radio frequency field strength and the working voltage based on a current scan have a corresponding linear compensation value in the commonly used lookup table, the linear compensation value is selected from the commonly used lookup table, and if not, the linear compensation value is selected from the real-time optimized lookup table.

An exemplary embodiment of the present invention further provides a non-transitory computer-readable storage medium for storing a computer program, wherein when executed by a computer, the computer program causes the computer to perform the linear compensation method described above.

An exemplary embodiment of the present invention further provides a linear compensation apparatus, wherein the linear compensation apparatus comprises a control module, a lookup module, and a compensation module. The control module is configured to determine a working voltage of a radio frequency amplifier, the lookup module is configured to determine a corresponding linear compensation value based on the working voltage, and the compensation module is configured to perform linear compensation on the radio frequency amplifier based on the linear compensation value.

Further, the control module is further configured to: obtain a current radio frequency field strength of the magnetic resonance imaging system, and obtain the working voltage of the radio frequency amplifier based on the radio frequency field strength and a characteristic of the radio frequency amplifier.

Still further, the control module is further configured to estimate the radio frequency field strength based on a set scanning parameter.

Further, the lookup module is further configured to select a linear compensation value corresponding to the working voltage from a lookup table based on the working voltage.

Still further, the lookup table comprises a preset lookup table corresponding to a constant load.

Still further, the lookup table comprises a real-time optimized lookup table corresponding to a real-time load.

Still further, the lookup module selects a lookup table from the preset lookup table and the real-time optimized lookup table based on an application scenario, so as to perform linear compensation value.

Further, the linear compensation apparatus further comprises an optimization module, wherein the optimization module is configured to: obtain a linear open-loop characteristic of the radio frequency amplifier corresponding to a current load; and modify the preset lookup table based on the linear open-loop characteristic to form the real-time optimized lookup table. Further, the linear open-loop characteristic comprises being obtained based on a training pulse inputted to the radio frequency amplifier.

Still further, the lookup table comprises a commonly used lookup table.

Still further, the linear compensation apparatus further comprises a learning module, wherein the learning module is configured to sort the real-time optimized lookup tables used for a plurality of scans within a predetermined time period and select at least one lookup table based on the sorting result as the commonly used lookup table. Further, the control module is further configured to select the linear compensation value from the real-time optimized lookup table or the commonly used lookup table based on whether the working voltage and the radio frequency field strength have a corresponding linear compensation value in the commonly used lookup table.

An exemplary embodiment of the present invention further provides a magnetic resonance imaging system comprising the linear compensation apparatus as described above.

Further, the magnetic resonance imaging system further comprises a power supply control board of a radio frequency amplifier, configured to control a supply voltage of the radio frequency amplifier based on the working voltage.

Other features and aspects will become clear through the following detailed description, accompanying drawings and claims.

BRIEF DESCRIPTION OF THE DRAWINGS

The present invention may be better understood by describing exemplary embodiments of the present invention with reference to accompanying drawings, in which.

DESCRIPTION OF EMBODIMENTS

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The words "first," "second" and similar words used in the description and claims of the patent application of the present invention do not denote any order, quantity or importance, but are merely intended to distinguish between different constituents. "One," "a(n)" and similar words are not meant to be limiting, but rather denote the presence of at least one. The word "include," "comprise" or a similar word is intended to mean that an element or article that appears before "include" or "comprise" encompasses an element or article and equivalent elements that are listed after "include" or "comprise," and does not exclude other elements or articles. The word "connect," "connected" or a similar word is not limited to a physical or mechanical connection, and is not limited to a direct or indirect connection.

Figure 1:
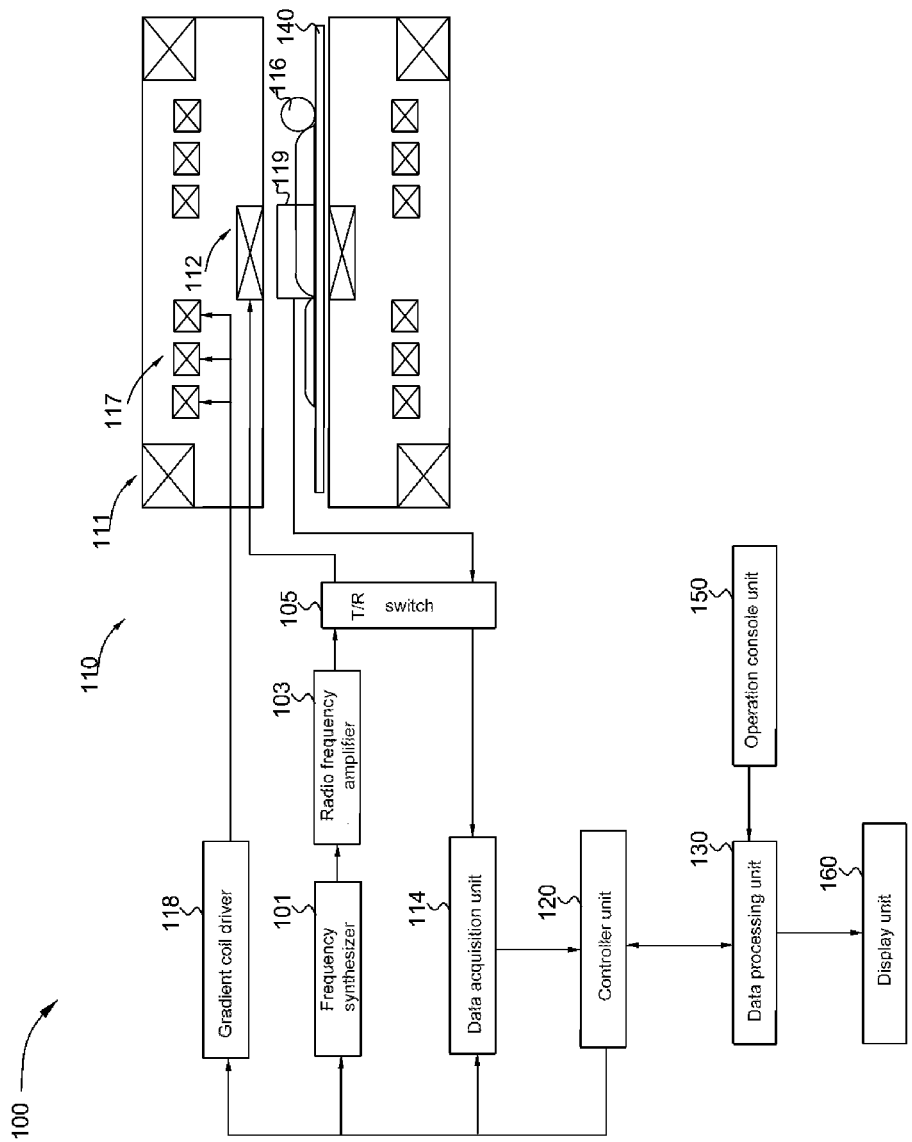
FIG. 1 is a schematic diagram of a magnetic resonance imaging system according to some embodiments of the present invention.

FIG. 1 shows a schematic diagram of an MRI system 100 according to some embodiments of the present invention. As shown in FIG. 1, the MRI system 100 includes a scanner 110, a controller unit 120, and a data processing unit 130. The MRI system 100 is described only as an example. In other embodiments, the MRI system 100 may have various variations, as long as image data can be acquired from an examination subject.

The scanner 110 may be configured to obtain data of an examination subject 116. The controller unit 120 is coupled to the scanner 110 to control the operation of the scanner 110. The scanner 110 may include a main magnet 111, a radio frequency transmit coil 112, a frequency synthesizer 101, a radio frequency amplifier 103, a transmit/receive switch (T/R switch) 105, a gradient coil system 117, a gradient coil driver 118, and a radio frequency receive coil 119.

The main magnet 111 generally includes, for example, an annular superconducting magnet. The annular superconducting magnet is installed in an annular vacuum container. The annular superconducting magnet defines a cylindrical space surrounding the examination subject 116. Moreover, a constant static magnetic field, such as a static magnetic field B0, is generated along a Z direction of the cylindrical space. The MRI system 100 uses the formed static magnetic field B0 to emit a magnetostatic pulse signal to the examination subject 116 placed in an imaging space, so that the precession of protons in the body of the examination subject 116 is ordered to generate a longitudinal magnetization vector.

The frequency synthesizer 101 is configured to generate a radio frequency pulse. The radio frequency pulse may include a radio frequency excitation pulse. The radio frequency excitation pulse is amplified by the radio frequency amplifier 103 and is then applied to the radio frequency transmit coil 112 by the T/R switch 105, so that the radio frequency transmit coil 112 emits to the examination subject 116 a radio frequency magnetic field B1 orthogonal to the static magnetic field B0 so as to excite nuclei in the body of the examination subject 116, and the longitudinal magnetization vector is converted into a transverse magnetization vector. After the end of the radio frequency excitation pulse, a free induction decay signal, i.e., a magnetic resonance signal that can be acquired, is generated in the process in which the transverse magnetization vector of the examination subject 116 gradually returns to zero.

The radio frequency transmit coil 112 may be a body coil, wherein the body coil may be connected to the T/R switch 105. Through control of the T/R switch, the body coil can be switched between a transmit mode and a receive mode. In the receive mode, the body coil may be configured to receive a magnetic resonance signal from the examination subject 116. In addition, the radio frequency transmit coil 112 may also be a local coil, such as a head coil.

In some embodiments, the radio frequency transmit coil is not limited to the body coil and local coil mentioned in the present application, and may also include other appropriate types of appropriate coils. The radio frequency receive coil is also not limited to the body coil, local coil, and surface coil mentioned in the present application, and may also include other appropriate types of coils.

Figure 2:
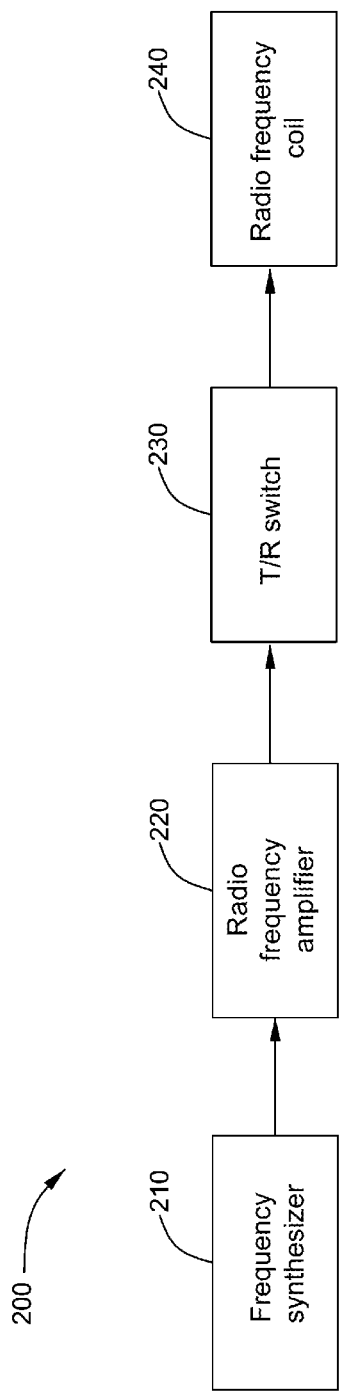
FIG. 2 is a schematic diagram of a radio frequency transmit link in the magnetic resonance imaging system shown according to FIG. 1.

In some embodiments, the frequency synthesizer 101, the radio frequency amplifier 103, the T/R switch 105, and the radio frequency transmit coil 112 together constitute a radio frequency transmit link in the magnetic resonance imaging system, as shown in FIG. 2. The linearity (also referred to as fidelity) of the radio frequency transmit link is an important factor that affects the resolution of magnetic resonance imaging. The radio frequency amplifier configured to amplify a signal has the greatest impact on the linearity. However, the efficiency of the radio frequency amplifier is affected while ensuring the linearity of the radio frequency amplifier.

At the same output power, the efficiency can be increased by improving the working voltage of the radio frequency amplifier. However, in an actual operation process, when the working voltage is changed, a gain characteristic (or an amplification factor) of the radio frequency amplifier also changes, and the output power also correspondingly changes. Therefore, when the efficiency of the radio frequency amplifier is increased by improving the working voltage, linear compensation needs to be performed on the radio frequency amplifier, so as to ensure the linearity of the radio frequency amplifier.

The gradient coil system 117 forms a magnetic field gradient in the imaging space so as to provide three-dimensional position information for the magnetic resonance signal described above. The magnetic resonance signal may be received by the radio frequency receive coil 119, or by the body coil or the local coil in the receive mode. The data processing unit 130 may process the received magnetic resonance signal so as to obtain required images or image data.

Specifically, the gradient coil system 117 may include three gradient coils. Each of the three gradient coils generates a gradient magnetic field inclined to one of three spatial axes (for example, X-axis, Y-axis, and Z-axis) perpendicular to one another, and generates a gradient field according to imaging conditions in each of a slice selection direction, a phase-encoding direction, and a frequency-encoding direction. More specifically, the gradient coil system 117 applies a gradient field in the slice selection direction of the examination subject 116 so as to select a slice. The radio frequency transmit coil 112 emits a radio frequency excitation pulse to the slice selected for the examination subject 116 and excites the slice. The gradient coil system 117 also applies a gradient field in the phase-encoding direction of the examination subject 116 so as to perform phase encoding on a magnetic resonance signal of the excited slice. The gradient coil system 117 then applies a gradient field in the frequency-encoding direction of the examination subject 116 so as to perform frequency encoding on the magnetic resonance signal of the excited slice.

The gradient coil driver 118 is configured to respectively provide a suitable power signal for the aforementioned three gradient coils in response to a sequence control signal transmitted by the controller unit 120.

The scanner 110 may further include a data acquisition unit 114. The data acquisition unit 114 is configured to acquire a magnetic resonance signal received by a radio frequency surface coil 119 or the body coil. The data acquisition unit 114 may include, for example, a radio frequency preamplifier (not shown), a phase detector (not shown), and an analog-to-digital converter (not shown), wherein the radio frequency preamplifier is configured to amplify a magnetic resonance signal received by the radio frequency surface coil 119 or the body coil. The phase detector is configured to perform phase detection on the amplified magnetic resonance signal. The analog-to-digital converter is configured to convert the magnetic resonance signal on which the phase detection has been performed from an analog signal to a digital signal. The data processing unit 130 can perform processing such as calculation and reconstruction on the digitized magnetic resonance signal so as to acquire a medical image.

The data processing unit 130 may include a computer and a storage medium. A program of predetermined data processing to be executed by the computer is recorded on the storage medium. The data processing unit 130 may be connected to the controller unit 120 and perform data processing based on a control signal received from the controller unit 120. The data processing unit 130 may also be connected to the data acquisition unit 114 to receive a magnetic resonance signal output by the data acquisition unit 114, so as to perform the aforementioned data processing.

The controller unit 120 may include a computer and a storage medium, where the storage medium is used to store a program executable by the computer, and when the computer executes the program, a plurality of components of the scanner 110 are enabled to implement operations corresponding to the aforementioned imaging sequence. The data processing unit 130 may also be caused to perform predetermined data processing.

The storage medium of the controller unit 120 and the data processing unit 130 may include, for example, a ROM, a floppy disk, a hard disk, an optical disk, a magneto-optical disk, a CD-ROM, or a non-volatile memory card.

The controller unit 120 may be set and/or arranged for use in different manners. For example, in some implementations, a single controller unit 120 may be used. In other implementations, a plurality of controller units 120 are configured to work together (for example, based on distributed processing configuration) or separately, where each controller unit 120 is configured to handle specific aspects and/or functions, and/or to process data used to generate a model used only for a specific medical imaging system 100. In some implementations, the controller unit 120 may be local (for example, in the same place as one or a plurality of medical imaging systems 100, for example, in the same facility and/or the same local network). In other implementations, the controller unit 120 may be remote and thus can only be accessed via a remote connection (for example, via the Internet or other available remote access technologies). In a specific implementation, the controller unit 120 may be configured in a manner similar to that of cloud technology, and may be accessed and/or used in a manner substantially similar to that of accessing and using other cloud-based systems.

The MRI system 100 further includes an examination table 140 on which the examination subject 116 is placed. The examination subject 116 may be moved into or out of the imaging space by moving the examination table 140 based on the control signal from the controller unit 120.

The MRI system 100 further includes an operation console unit 150 connected to the controller unit 120. The operation console unit 150 may send an acquired operation signal to the controller unit 120 so as to control operation states of the aforementioned components, for example, the examination table 140 and the scanner 110. The operation signal may include, for example, a scanning protocol and a parameter selected manually or automatically. The scanning protocol may include the aforementioned imaging sequence. In addition, the operation console unit 150 may transmit the obtained operation signal to the controller unit 120 to control the data processing unit 130, so as to obtain a desired image.

The operation console unit 150 may include a user input device such as a keyboard, a mouse, a voice activated controller, or any other suitable input devices, by which an operator may input an operation signal/control signal to the controller unit 120.

The MRI system 100 may further include a display unit 160 that may be connected to the operation console unit 150 to display an operation interface and may further be connected to the data processing unit 130 to display the image.

In some embodiments, the system 100 may be connected, via one or more configurable wired and/or wireless networks such as the Internet and/or a virtual private network, to one or more display units, cloud networks, printers, workstations, and/or similar apparatuses located locally or remotely.

Figure 6:
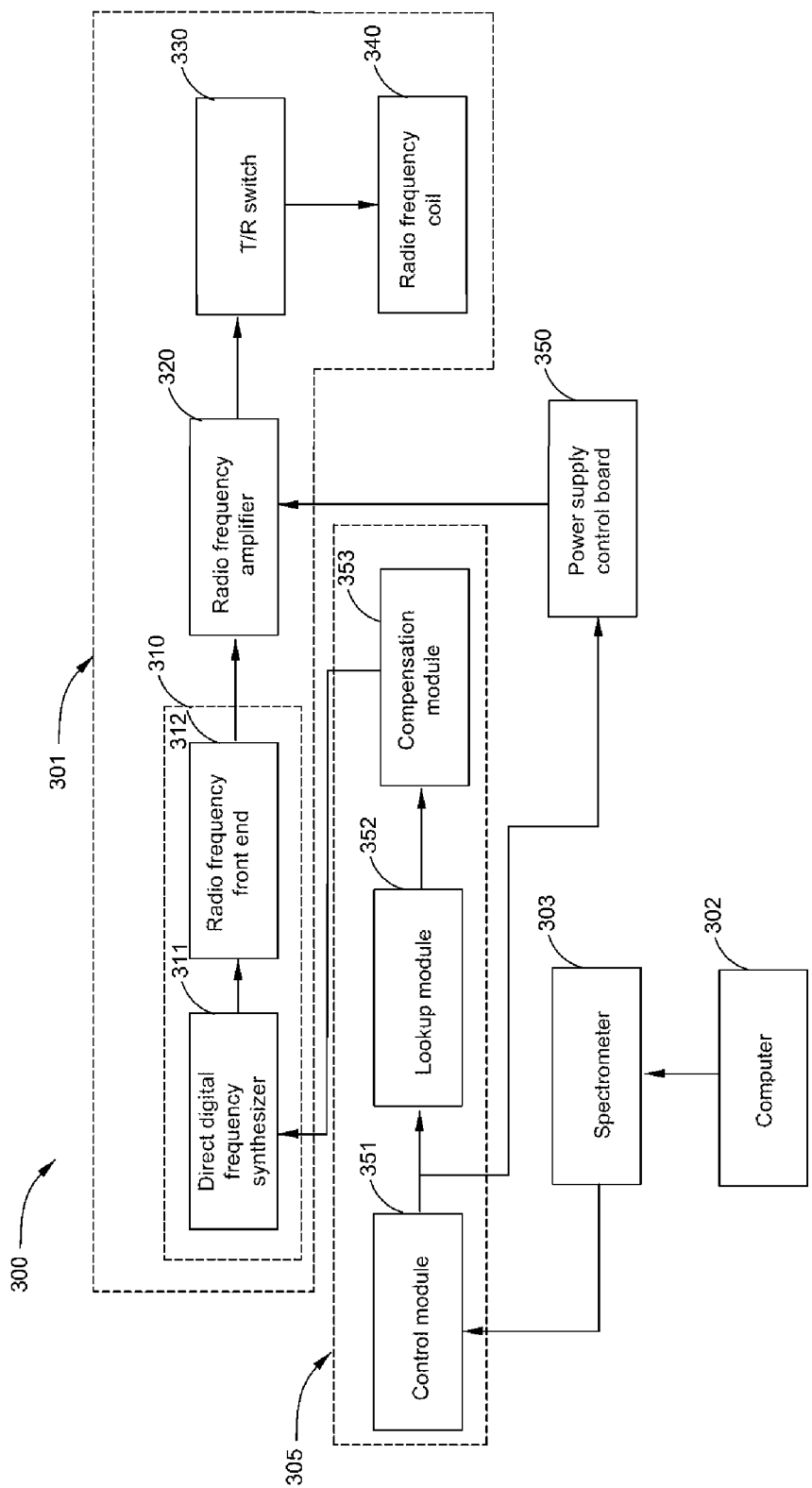
FIG. 6 is a schematic diagram of a magnetic resonance imaging system for performing linear compensation on a radio frequency amplifier according to some embodiments of the present invention.

FIG. 6 shows a magnetic resonance imaging system 300 for performing linear compensation on a radio frequency amplifier according to some embodiments of the present invention. To describe a linear compensation principle of the radio frequency amplifier, some modules or units in the magnetic resonance imaging system are omitted in FIG. 6. As shown in FIG. 6, the magnetic resonance imaging system 300 includes a radio frequency transmit link 301, a computer 302, and a spectrometer 303.

The computer 302 is configured to obtain a radio frequency field strength B1 distributed in an imaging space of the magnetic resonance imaging system. In some embodiments, generally, before an examination subject enters a scan room for preparation of scanning, a user (for example, a doctor) selects a scanning sequence and sets a scanning parameter by using an operation console unit or other input unit. The computer 302 may estimate (or calculate) the radio frequency field strength B1 based on the scanning sequence and the scanning parameter, and send the information to the spectrometer 303. Specifically, the computer 302 may send the radio frequency field strength B1 to the spectrometer 303 via Ethernet. In some embodiments, the computer 302 may be a computer in the data processing unit 130 shown in FIG. 1, or may be a computer in the controller unit 120 shown in FIG. 1, or certainly may be a computer separately disposed in other manner.

The spectrometer 303 is configured to convert the radio frequency field strength B1 into an electrical signal. The radio frequency transmit link 301 includes a frequency synthesizer 310, a radio frequency amplifier 320, a T/R switch 330, and a radio frequency transmit coil 340. The frequency synthesizer (or exciter) 310 in a conventional radio frequency transmit link includes a direct digital frequency synthesizer 311 and a radio frequency front end 312. The direct digital frequency synthesizer 311 is configured to generate a radio frequency pulse (or signal), and the radio frequency front end 312 may send the radio frequency pulse to the radio frequency amplifier 320. Generally, in the conventional radio frequency transmit link, a working voltage of the radio frequency amplifier is between 60 V-165 V, and turn-on and turn-off characteristics of a metal oxide semi-conductor field effect transistor (MOSFET) in the radio frequency amplifier 320 can be controlled by setting the working voltage, so as to achieve a preset output power. In some embodiments, the working voltage of the radio frequency amplifier is determined according to a transistor selected when the radio frequency amplifier is designed. According to different settings, the working voltage of the radio frequency amplifier may also be between 32 V-165 V.

The magnetic resonance imaging system 300 further includes a linear compensation apparatus 305. The linear compensation apparatus 305 includes a control module 351, a lookup module 352, and a compensation module 353.

The control module 351 is configured to determine a working voltage of the radio frequency amplifier 320. Specifically, the control module 351 is configured to obtain the working voltage of the radio frequency amplifier 320 based on the obtained current radio frequency field strength B1 of the magnetic resonance imaging system and a characteristic of the radio frequency amplifier 320. The control module 351 is further configured to estimate the radio frequency field strength B1 based on a set scanning parameter. In some embodiments, the control module 351 obtains the working voltage of the radio frequency amplifier 320 based on an electrical signal corresponding to the radio frequency field strength B1 and the characteristic of the radio frequency amplifier 320. The characteristic of the radio frequency amplifier 320 includes a characteristic in which at least one of a gain, phase, and efficiency of the radio frequency amplifier changes with an output power.

Figure 5:
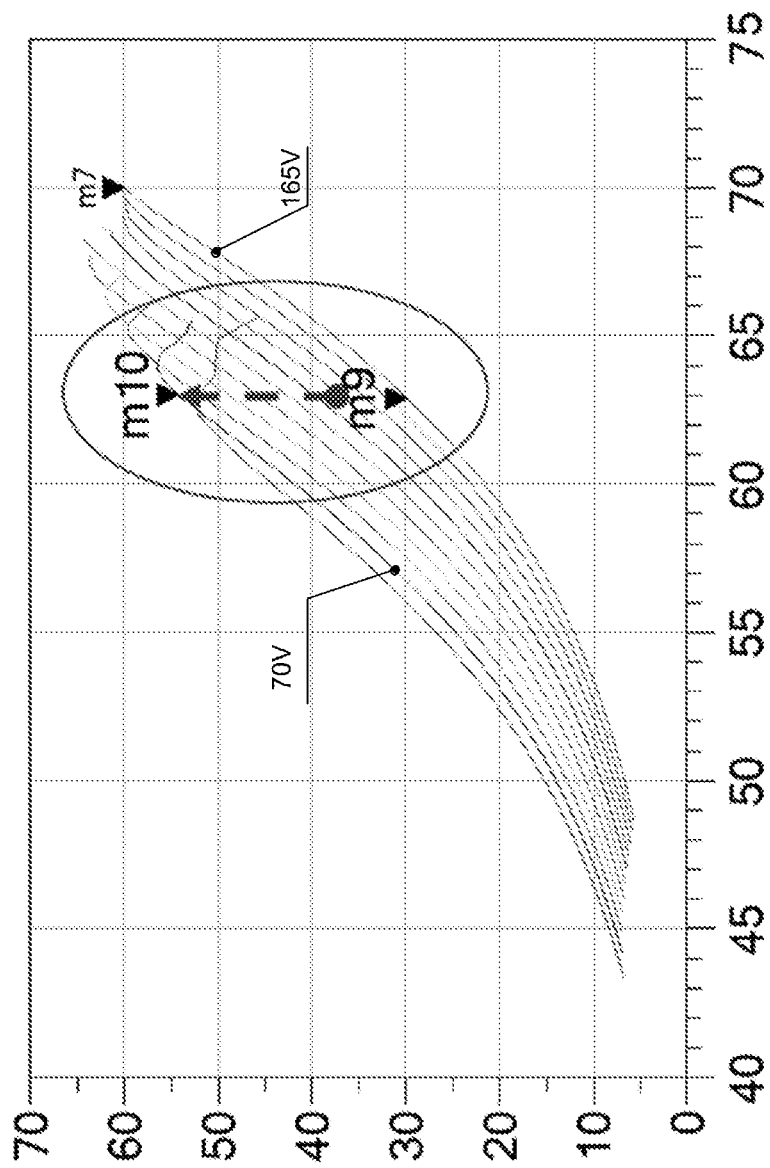
FIG. 5 is a trend graph showing the efficiency of a radio frequency amplifier at different working voltages changes with the output power.

In some embodiments, a gain characteristic (amplification characteristic) of the radio frequency amplifier 320 is known, and a characteristic in which the efficiency of the radio frequency amplifier at different working voltages changes with the output power (as shown in FIG. 5) is also known. For example, when the output power is 62 dBm, the radio frequency amplifier may obtain the maximum efficiency at a working voltage of 70 V. Through the radio frequency field strength B1, an output power required by the radio frequency amplifier for the current examination subject may be obtained, and the working voltage of the radio frequency amplifier may also be obtained. Therefore, through the radio frequency field strength B1 (or the electrical signal corresponding thereto) and the characteristic of the radio frequency amplifier, the working voltage having a relatively high efficiency at the output power may be obtained.

In some embodiments, the control module 351 includes a storage module (not shown). The storage module stores a lookup table (LUT) of the radio frequency field strength B1—the working voltage. Through the determined radio frequency field strength B1, an optimal working voltage corresponding to the radio frequency amplifier may be obtained from the lookup table. However, a person skilled in the art should understand that determining a working voltage of a radio frequency amplifier through the radio frequency field strength B1 is not limited to using the foregoing lookup table. Any other suitable manner, such as calculation and estimation, may be applied.

In some embodiments, the control module 351 may be integrated into the spectrometer 303. In this case, the spectrometer 303 transmits the determined working voltage to the lookup module 352 by means of the DVMR transmission protocol. In this process, data transmitted by means of the DVMR transmission protocol includes not only a radio frequency-related data signal but also a gradient-related data signal. As the present invention mainly relates to the radio frequency-related data signal, the gradient-related data signal is omitted in the following description.

The lookup module 352 is configured to determine a corresponding linear compensation value based on the working voltage. Specifically, the lookup module 352 is further configured to select a linear compensation value corresponding to the working voltage from the lookup table based on the working voltage. The linear compensation value includes a gain compensation value and a phase compensation value.

In some embodiments, the lookup table includes a preset lookup table (working voltage-gain and phase compensation) corresponding to a constant load, and the working voltage of the radio frequency amplifier is between 60 V-165 V. Therefore, the preset lookup table includes linear compensation values corresponding to each interval of 10 V from 60 V to 165 V, that is, 60 V, 70 V . . . , 165 V. Certainly, for more accurate linear compensation, a voltage interval in the lookup table may also be set to be smaller. For example, a corresponding linear compensation value is set for each interval of 5 V. On the contrary, in consideration of storage space, the voltage interval in the lookup table may also be set to be larger.

In some embodiments, the lookup table may be stored in a storage module in the lookup module 352, may be stored in a storage module in the frequency synthesizer 310, or may be stored in a form of cloud storage.

In some embodiments, the preset lookup table, that is, the working voltage-gain and phase compensation, may be combined with the lookup table of the radio frequency field strength B1—working voltage in the control module 351 as one lookup table having the working voltage corresponding to the radio frequency field strength B1 and the gain and phase compensation at the working voltage. In some embodiments, the control module 351 and the lookup module 352 may be integrated.

The compensation module 353 is configured to perform linear compensation on the radio frequency amplifier 320 based on the linear compensation value. In some embodiments, the gain compensation and phase compensation obtained through the look-up may be sent to the direct digital frequency synthesizer 311, and in some other embodiments, the gain compensation and phase compensation obtained through the look-up may also be sent directly to the radio frequency amplifier 320.

In some embodiments, both the lookup module 352 and the compensation module 353 are disposed in the frequency synthesizer 310.

In some embodiments, the radio frequency transmit link 301 further includes a power supply control board 350 configured to supply the working voltage to the radio frequency amplifier. The power supply control board 350 is configured to control a supply voltage of the radio frequency amplifier based on the working voltage. The control module 351 sends the determined working voltage to the power supply control board 350 by means of a CAN bus, Ethernet, or in another control manner. The power supply control board 350 includes a control board and a radio frequency board (not shown). The control board may convert the working voltage into a control signal, so as to control the radio frequency board to supply a required working voltage to the radio frequency amplifier 320. Specifically, the radio frequency board may supply the working voltage (i.e., a supply voltage) to a drain of the radio frequency amplifier 320. In some embodiments, the power supply control board 350 is integrated with the radio frequency amplifier 320 and disposed in a component enclosure.

Figure 7:
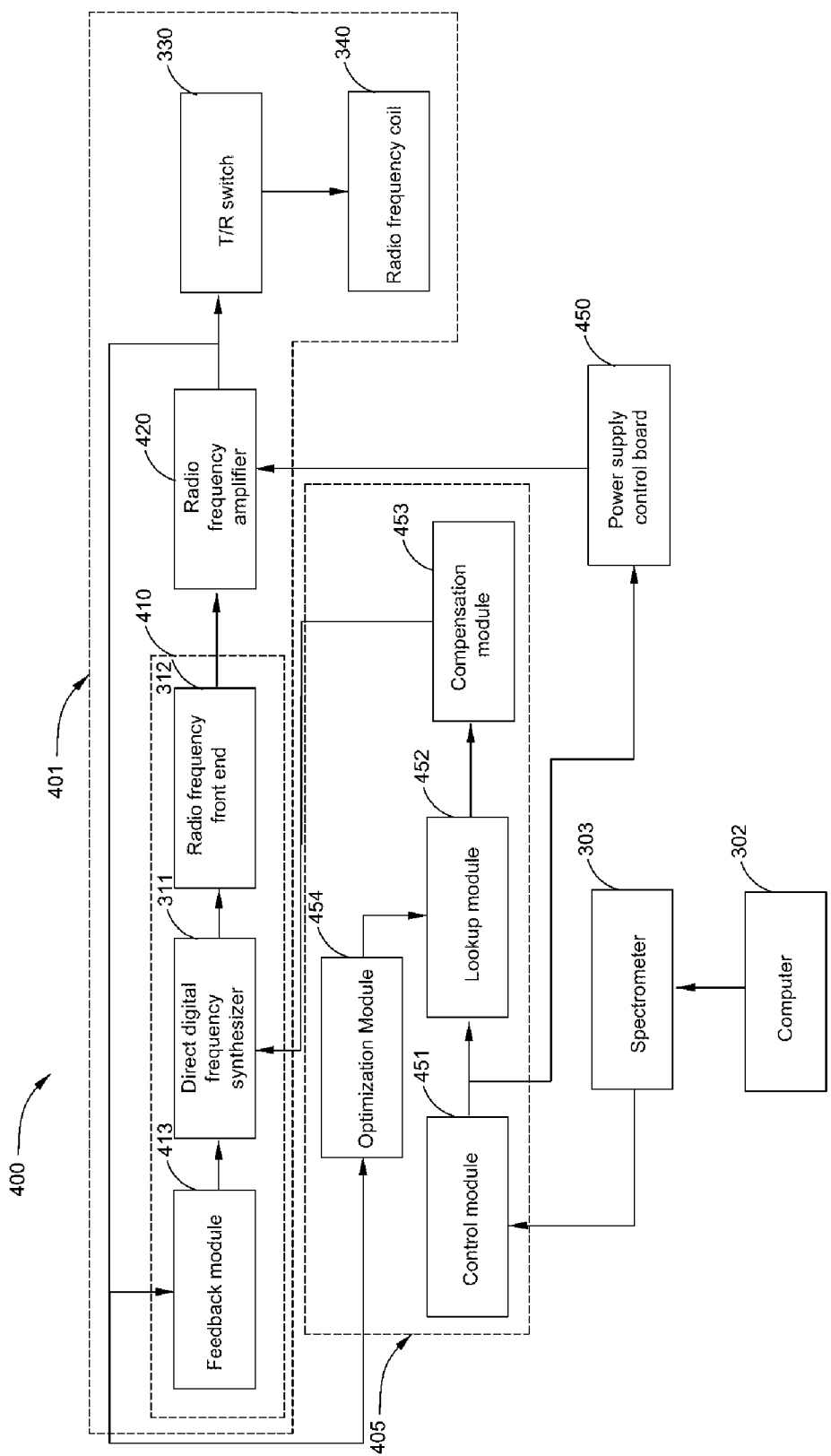
FIG. 7 is a schematic diagram of a magnetic resonance imaging system for performing linear compensation on a radio frequency amplifier according to some other embodiments of the present invention.

FIG. 7 shows a magnetic resonance imaging system 400 for performing linear compensation on a radio frequency amplifier according to some other embodiments of the present invention. Unlike the magnetic resonance imaging system 300 shown in FIG. 6, a radio frequency transmit link in the magnetic resonance imaging system 400 shown in FIG. 7 is a non-magnetic (or magnetically shielded) transmit link, and a frequency synthesizer, a radio frequency amplifier, a radio frequency coil assembly, and the like may be disposed in a scan room of the magnetic resonance imaging system.

Figure 3:
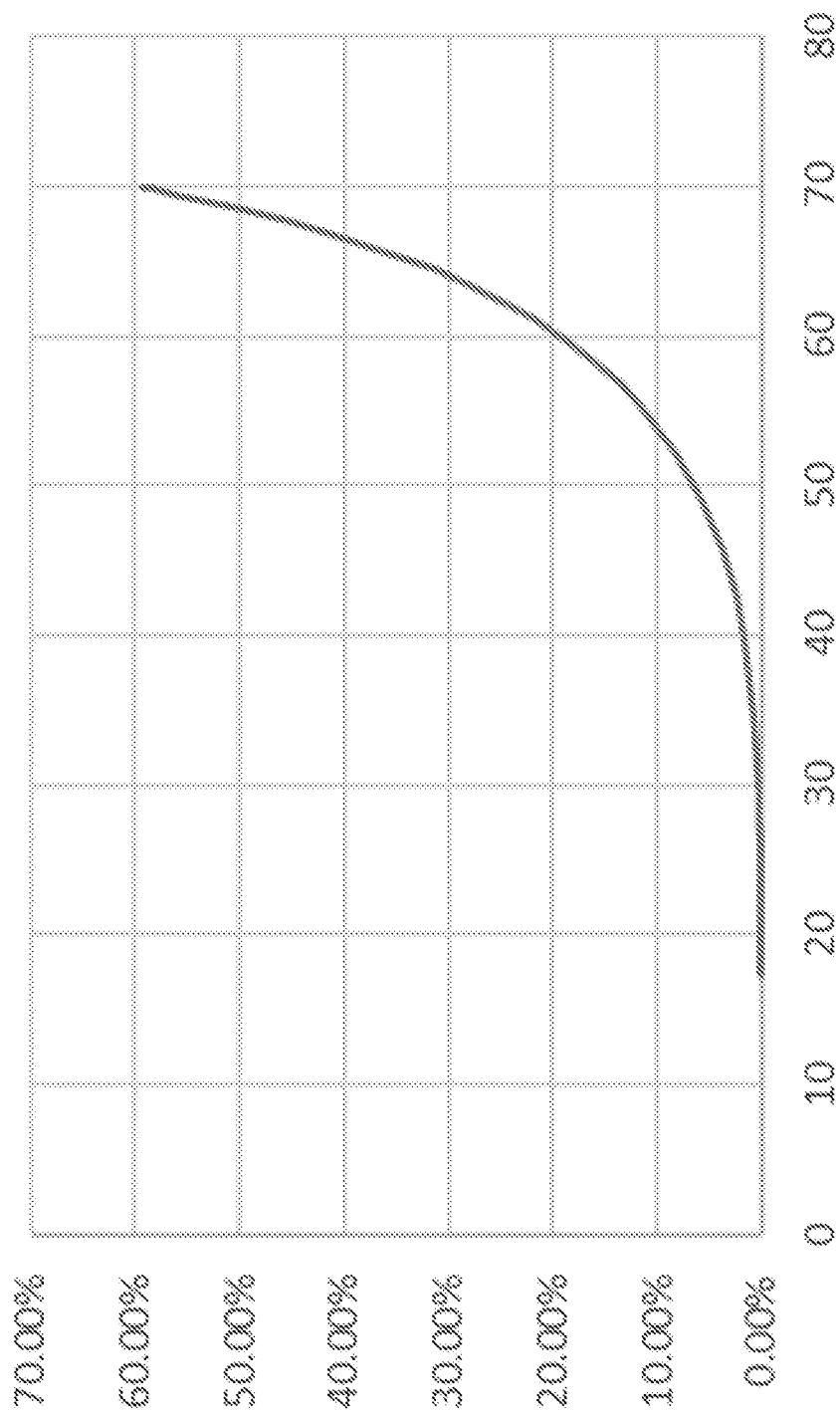
FIG. 3 is a trend graph showing the efficiency of a radio frequency amplifier changes with the output power.
Figure 4:
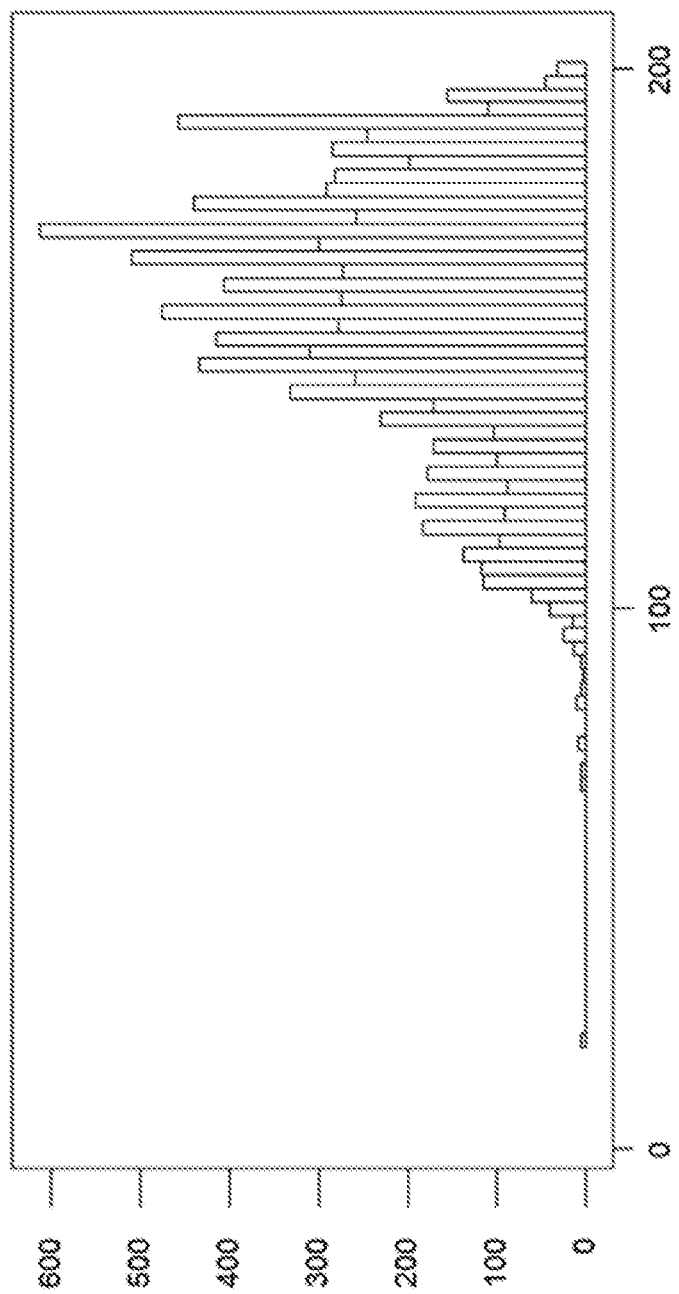
FIG. 4 is a distribution diagram of use frequency of transmit power of a radio frequency coil.

The radio frequency transmit link 401 includes a radio frequency control engine 410, a radio frequency amplifier 420, a T/R switch 330, and a radio frequency transmit coil 340. The radio frequency control engine 410 may implement the function of the frequency synthesizer 310 shown in FIG. 3. Specifically, the radio frequency control engine 410 includes the direct digital frequency synthesizer 311 and the radio frequency front end 312. The radio frequency control engine 410 further includes a feedback module 413. The feedback module 413 may send an output power of the radio frequency amplifier 420 as feedback to the direct digital frequency synthesizer 311, so as to perform feedback compensation on the radio frequency amplifier. In this process, the feedback compensation has a relatively low precision and belongs to "coarse adjustment".

The radio frequency amplifier 420 in the non-magnetic transmit link 401 generally works at 50 V-65 V.

A linear compensation apparatus 405 includes a control module 451, a lookup module 452, and a compensation module 453.

The control module 451 is configured to determine a working voltage of the radio frequency amplifier 320. The lookup module 452 is configured to determine a corresponding linear compensation value based on the working voltage. The compensation module 353 is configured to perform linear compensation on the radio frequency amplifier 320 based on the linear compensation value.

In some embodiments, initially, a lookup table includes a preset lookup table of the radio frequency field strength B1—working voltage-gain and phase compensation. However, in an actual scanning process, the loads are different, that is, when examination subjects or scanning parts are different, for example, different parts of an adult and a child are scanned, a different output power is required and gain characteristics of the radio frequency amplifier may also be different due to different loads. Even if linear compensation is performed by using the preset lookup table, a large deviation may occur in linear compensation. Therefore, in this embodiment, the lookup module 452 may be a real-time optimized lookup table based on a real-time load.

Therefore, the linear compensation apparatus 405 further includes an optimization module 454. The optimization module 454 is configured to: obtain a linear open-loop characteristic of the radio frequency amplifier corresponding to a current load, and modify the preset lookup table based on the linear open-loop characteristic to obtain a real-time optimized lookup table. In some embodiments, the linear open-loop characteristic comprises being obtained based on a training pulse inputted to the radio frequency amplifier 320, and the training pulse is transmitted at a pre-scanning stage of the system. The term "pre-scanning" refers to a scanning process performed to locate a region of interest of the examination subject before a formal scan.

Pre-scanning is a scanning process performed before a formal scan is performed in the MRI system. Obtaining the linear open-loop characteristic of the radio frequency amplifier in the pre-scanning process enables real-time optimization of the subsequent linear compensation, and as existing steps in the scanning process are used, no additional burden is imposed to the system.

Figure 8:
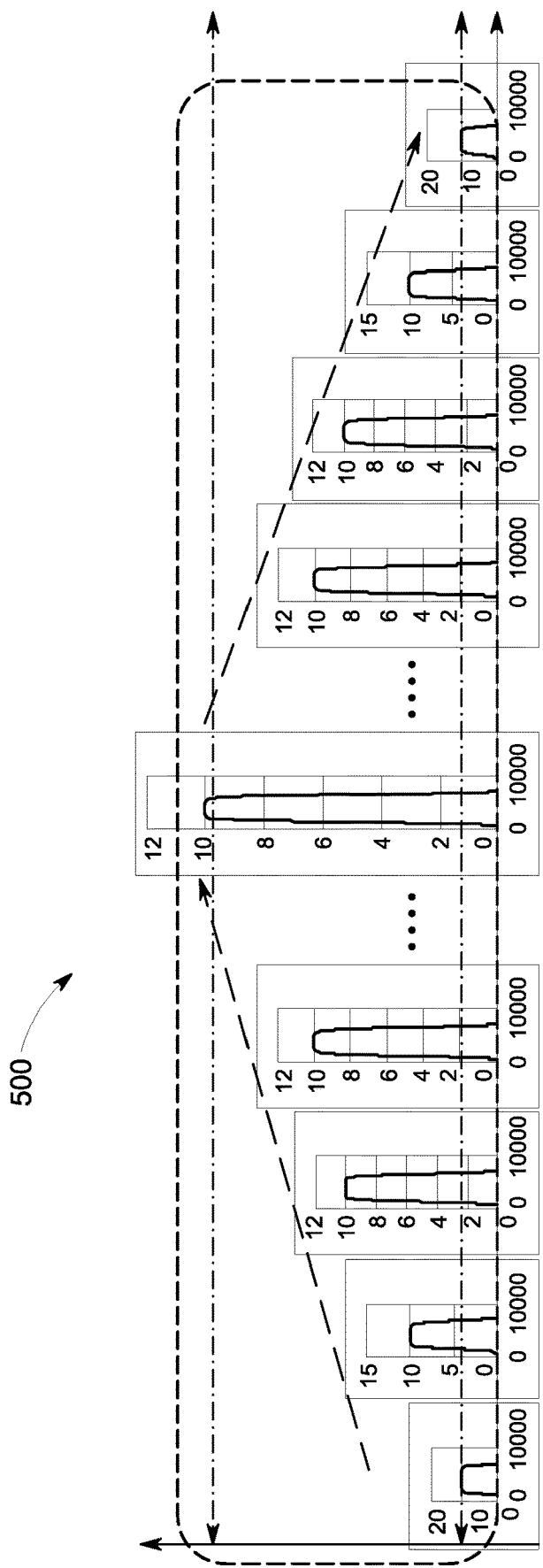
FIG. 8 is a schematic diagram of some embodiments of training pulses transmitted at an automatic pre-scanning stage to obtain a linear open-loop characteristic.

FIG. 8 is a schematic diagram of some embodiments of a training pulse transmitted at a pre-scanning stage to obtain a linear open-loop characteristic. As shown in FIG. 8, the training pulse is a group of pulses that are relatively short and have a trend to gradually increase and then gradually decrease. By using such a setting, heat consumption at the pre-scanning stage can be better reduced, and heat (or heat loss) can be excluded as much as possible, so as to obtain a more accurate or more precise open-loop characteristic.

Figure 9:
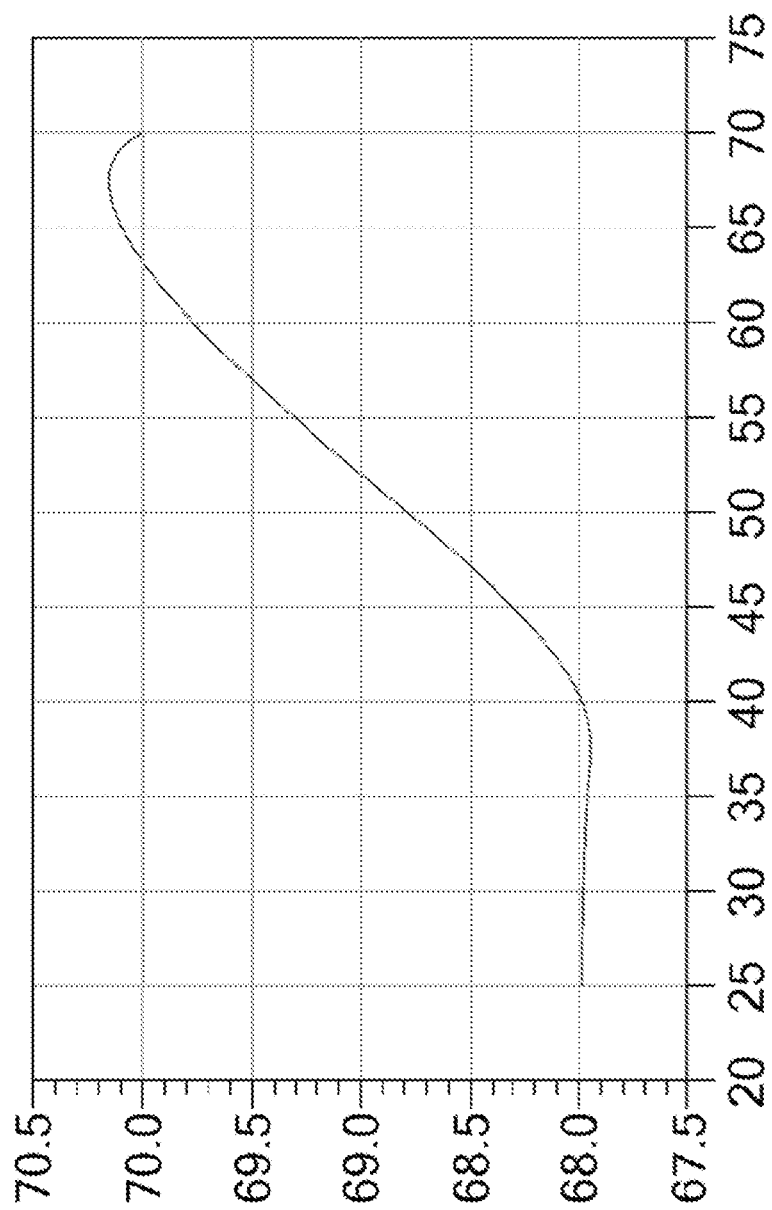
FIG. 9 is a schematic diagram of a linear open-loop characteristic of a radio frequency amplifier at a working voltage of 165 V.

The term "linear open-loop characteristic" refers to a characteristic in which the gain characteristic and the phase characteristic of the radio frequency amplifier at a working voltage determined relative to a load (for example, an examination subject) change with the output power. Specifically, FIG. 9 shows a change trend of the gain characteristic of the radio frequency amplifier relative to the output power at a working voltage of 165 V. As shown in FIG. 9, the horizontal coordinates are the output power, and the vertical coordinates are the gain characteristic. For the linear open-loop characteristic shown in FIG. 9 and obtained through automatic pre-scanning, the optimization module may determine gain compensation corresponding to the linear open-loop characteristic, so as to optimize the lookup table.

Although FIG. 9 shows only the gain characteristic of the radio frequency amplifier, a person skilled in the art should understand that the linear open-loop characteristic further includes the phase characteristic, that is, a change trend of the phase characteristic relative to the output power at a certain determined working voltage.

In some embodiments, some or all of the control module 451, the lookup module 452, the compensation module 453, and the optimization module 454 are integrated in the control engine 410.

In some embodiments, the radio frequency transmit link 401 further includes a power supply control board 450 of the radio frequency amplifier, and the control module 451 sends the obtained working voltage to the power supply control board 450 by means of the Ethernet, so as to provide the radio frequency amplifier 420 with a required working voltage. Unlike the embodiment shown in FIG. 6 in which the power supply control board 350 is integrated with the radio frequency amplifier 320 and disposed in a component cabinet in an equipment room, the power supply control board 450 is disposed in the equipment room, but the radio frequency amplifier 420 is disposed in a scan room.

Although FIG. 7 shows that the lookup table needs to be optimized in real time for the non-magnetic transmit link 401 to perform dynamic linear compensation, a person skilled in the art should understand that the non-magnetic transmit link 401 is not limited to using a real-time optimized lookup table, and the preset lookup table may also be used under certain conditions.

For example, the lookup module 452 (or the control engine 410 or another control apparatus) may select a lookup table from the preset lookup table or the real-time optimized lookup table based on an application scenario to perform linear compensation. In some embodiments, the selection of the lookup table type may be performed manually by the user. For example, the lookup module 452 directly receives a selection instruction of the user or selects a lookup table type based on an application scenario inputted by the user. The application scenario may include different combinations of a nature of a hospital, the common age of examination subjects, frequently scanned part, and the like. For example, for an orthopedic hospital, the frequently scanned part is a bone, or for a children's hospital, an examination subject is generally a child. For this specific scanning requirement, a load change is generally not too large, and linear compensation may be performed by using the preset fixed lookup table. However, for a general hospital, the age and scanning parts of examination subjects and the like are relatively diverse, and thus the linear compensation may be performed by using the real-time optimized lookup table.

Figure 10:
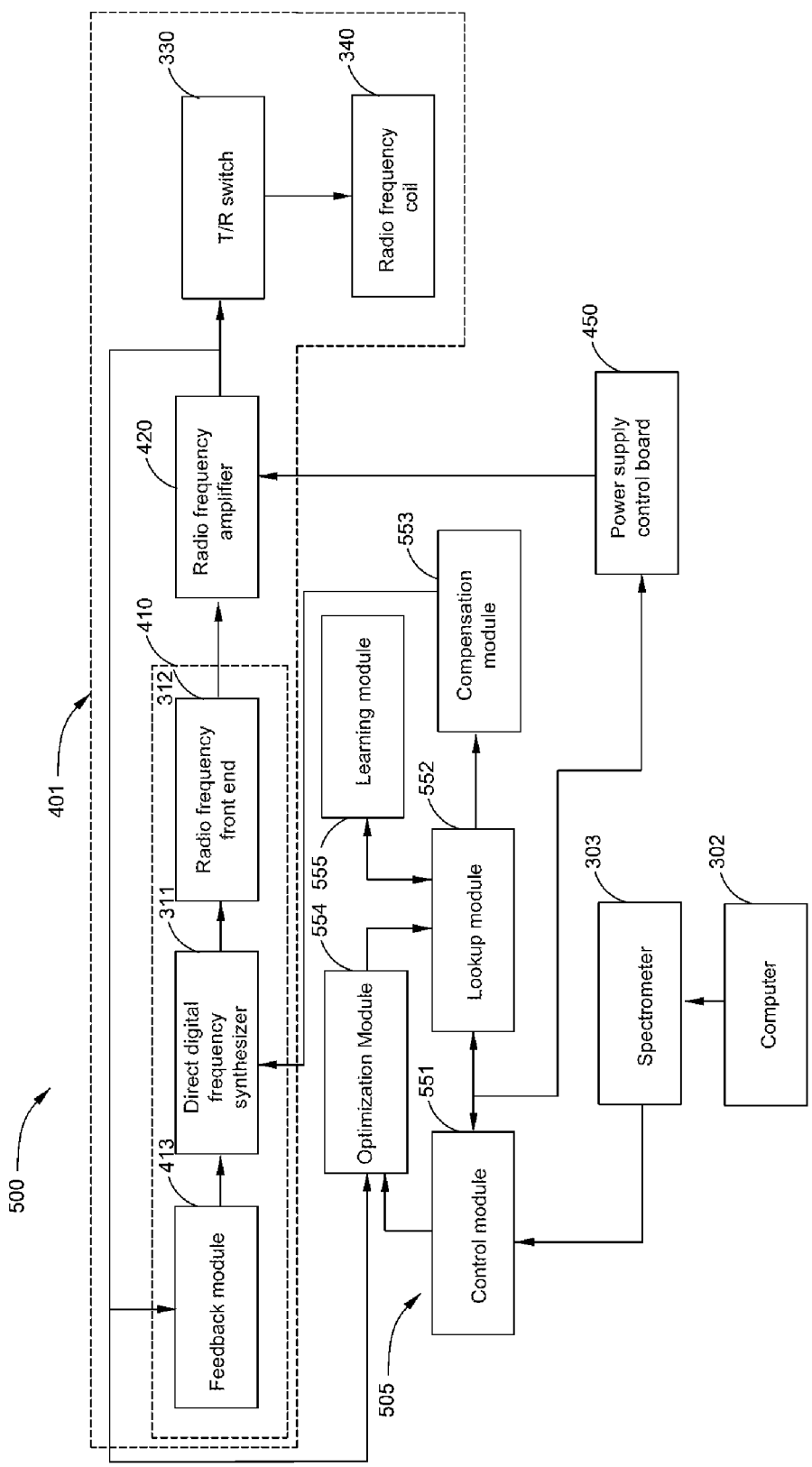
FIG. 10 is a schematic diagram of a magnetic resonance imaging system for performing linear compensation on a radio frequency amplifier according to still some other embodiments of the present invention.

FIG. 10 shows a magnetic resonance imaging system 500 for performing linear compensation on a radio frequency amplifier according to still some other embodiments. Unlike the magnetic resonance imaging system 400 shown in FIG. 7, a linear compensation apparatus 505 in the magnetic resonance imaging system 500 shown in FIG. 10 further includes a learning module 555. The learning module 555 is configured to sort real-time optimized lookup tables used for each scan within a predetermined time period, and select at least one lookup table based on the sorting result to obtain a commonly used lookup table. The sorting may be performed based on use frequency. For example, use counts of lookup tables used in all scans within three months may be sorted, and the top 10 lookup tables in the sorting may be selected to obtain a commonly used lookup table. The commonly used lookup table includes a radio frequency field strength B1, a working voltage of a corresponding radio frequency amplifier, and corresponding gain compensation and phase compensation.

In addition, a control module 551 is further configured to select the linear compensation value from the real-time optimized lookup table or the commonly used lookup table based on whether the working voltage and the radio frequency field strength have a corresponding linear compensation value in the commonly used lookup table. Specifically, initially, a lookup module 552 is the commonly used lookup table. After the control module 551 determines a working voltage of a radio frequency amplifier based on a radio frequency field strength B1 (or an electrical signal corresponding thereto) sent by a spectrometer 303, the control module 551 further searches (or traverses) the commonly used lookup table for a matching record (a linear compensation value) based on the current radio frequency field strength B1 and the working voltage, that is, to determine whether the current load is in the commonly used scan ranking. If the control module 551 can find a corresponding record in the commonly used lookup table, the control module 551 performs linear compensation on the radio frequency amplifier by using the gain and phase compensation in the commonly used lookup table. In addition, an optimization module 454 configured to optimize the lookup table in real time does not work, that is, does not need to transmit a training pulse at the pre-scanning stage. If the control module 551 does not find the corresponding record in the commonly used lookup table, the optimization module obtains the gain and phase compensation based on an obtained linear open-loop characteristic to perform linear compensation.

By setting the commonly used lookup table, the procedure can be simplified, so that for a common radio frequency field strength B1 and a working voltage that are corresponding to a common load, a training pulse does not need to be transmitted each time at the pre-scanning stage to optimize a record table; in addition, compared with the preset lookup table, a function of intelligently selecting a lookup table is enabled, and more intelligent and more accurate compensation can be performed.

The linear compensation apparatus in some embodiments of the present invention may include three working modes. The first mode is to perform linear compensation based on the preset lookup table, the second mode is to perform linear compensation based on the real-time optimized lookup table, and the third mode is to perform linear compensation based on the commonly used lookup table. In addition, switching may be performed between the first mode and the second mode based on an application scenario (such as the type of a hospital), and intelligent selection may be performed between the second mode and the third mode based on an application scenario (for example, whether the current load is the common load). To ensure both linearity and efficiency, a user can select an appropriate mode to perform linear compensation according to a requirement, so as to obtain an ideal effect.

Figure 11:
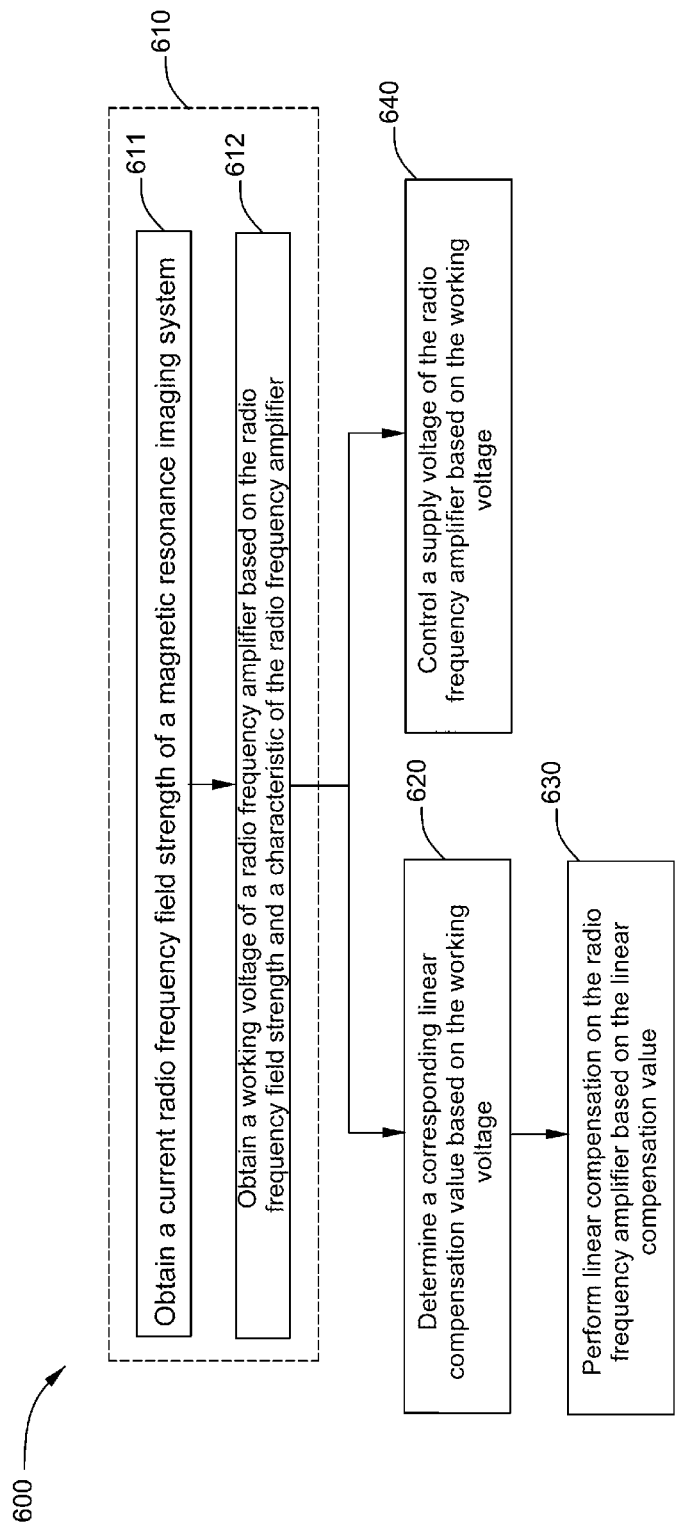
FIG. 11 is a flowchart of a linear compensation method for a radio frequency amplifier according to some embodiments of the present invention.

FIG. 11 shows a linear compensation method 600 for a radio frequency amplifier according to some embodiments of the present invention. As shown in FIG. 11, the linear compensation method 600 for the radio frequency amplifier includes step 610, step 620, and step 630.

In step 610, determining a working voltage of a radio frequency amplifier. In some embodiments, step 610 further includes step 611 and step 622.

In step 611, obtaining a current radio frequency field strength of the magnetic resonance imaging system. In some embodiments, the obtaining a current radio frequency field strength of a magnetic resonance imaging system includes estimating the radio frequency field strength based on a set scanning parameter. Specifically, the scanning parameter includes a scanning sequence. Specifically, before an examination subject enters a scan room for preparation of scanning, a user (for example, a doctor) selects a scanning sequence and a scanning parameter by using an operating console unit or other input unit, and a computer may estimate (or calculate) the radio frequency field strength based on the scanning sequence and the scanning parameter.

In some embodiments, step 611 further includes converting the radio frequency field strength into an electrical signal corresponding thereto. Specifically, a spectrometer receives the radio frequency field strength estimated by the computer, and converts the same into an electrical signal, so as to perform subsequent control.

In step 612, obtaining the working voltage of the radio frequency amplifier based on the radio frequency field strength (or the electrical signal corresponding thereto) and a characteristic of the radio frequency amplifier.

Specifically, the characteristic of the radio frequency amplifier includes a characteristic in which at least one of a gain, phase, and efficiency of the radio frequency amplifier changes with an output power. Specifically, a change trend of a gain characteristic (or a phase characteristic or efficiency) of the frequency amplifier relative to the output power at different working voltages is also determined. For example, when the output power is 62 dBm, the radio frequency amplifier may obtain the maximum efficiency at a working voltage of 70 V. By using the electrical signal corresponding to the radio frequency field strength, the output power required by the radio frequency amplifier for the current examination subject may be obtained, and the working voltage of the radio frequency amplifier may also be obtained. Therefore, by means of the electrical signal corresponding to the radio frequency field strength and the characteristic of the radio frequency amplifier, the working voltage having the relatively high efficiency at the output power may be obtained.

In step 620, selecting a linear compensation value corresponding to the working voltage based on the working voltage. In some embodiments, the selecting a linear compensation value corresponding to the working voltage based on the working voltage includes selecting the linear compensation value corresponding to the working voltage from a lookup table based on the working voltage, wherein the linear compensation value includes gain compensation and phase compensation. The selecting the linear compensation value corresponding to the working voltage from a lookup table includes selecting gain compensation and phase compensation from a preset lookup table corresponding to a constant load. Specifically, the preset lookup table includes an optimal working voltage corresponding to different radio frequency field strengths (that is, the output power of the radio frequency amplifier) and corresponding gain compensation and phase compensation that are determined based on the characteristic of the radio frequency amplifier in the case of the constant load.

In step 630, performing linear compensation on the radio frequency amplifier based on the linear compensation value. In some embodiments, the linear compensation value (including the gain compensation and phase compensation) may be used by a frequency synthesizer to perform compensation on the radio frequency amplifier, and in some other embodiments, the linear compensation value may also be directly sent to the radio frequency amplifier for compensation.

In some embodiments, the linear compensation method 600 for the radio frequency amplifier further includes step 640. In step 640, controlling a supply voltage of the radio frequency amplifier based on the working voltage.

Figure 12:
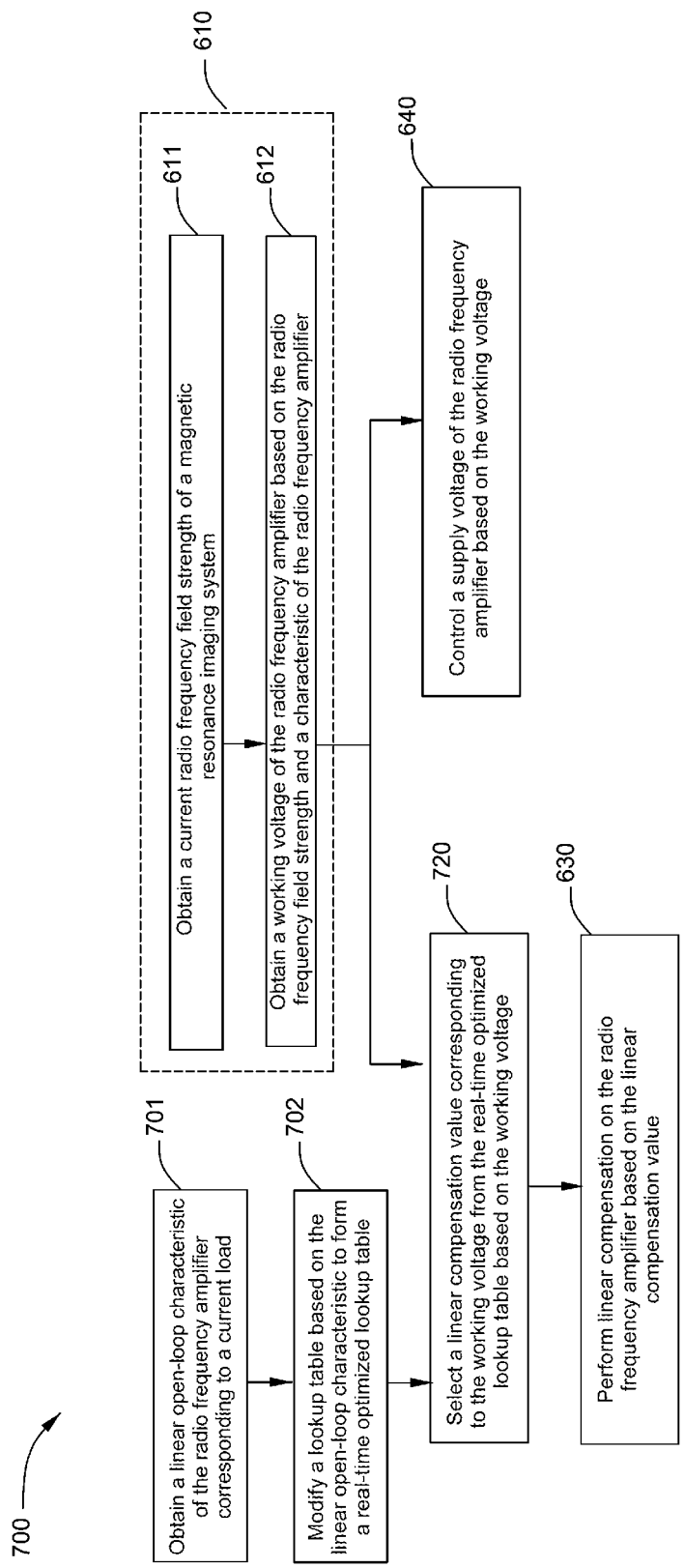
FIG. 12 is a flowchart of a linear compensation method for a radio frequency amplifier according to some other embodiments of the present invention.

FIG. 12 shows a linear compensation method 700 for a radio frequency amplifier according to some other embodiments of the present invention. Unlike the linear compensation method 600 shown in FIG. 11, in step 720 in the linear compensation method 700, the selecting a linear compensation value corresponding to the working voltage from a lookup table based on the working voltage includes selecting gain compensation and phase compensation from a real-time optimized lookup table corresponding to a real-time load.

In some embodiments, before step 720, the linear compensation method 700 further includes step 701 and step 702.

In step 701, obtaining a linear open-loop characteristic of the radio frequency amplifier corresponding to a current load.

Specifically, the linear open-loop characteristic comprises being obtained based on a training pulse inputted to the radio frequency amplifier, and the training pulse is transmitted at a pre-scanning stage of the system. Pre-scanning is a scanning process performed before a formal scan is performed in the MRI system. Obtaining the linear open-loop characteristic of the radio frequency amplifier in the pre-scanning process enables real-time optimization of the subsequent linear compensation, and as necessary steps in the imaging process are used, no additional burden is imposed to the system. In addition, the training pulse is a group of pulses that are relatively short and mails have a trend to gradually increase and then gradually decrease. By using such a setting, heat consumption at the pre-scanning stage can be better reduced, and impact of heat (or heat loss) on the gain characteristic of the radio frequency amplifier can be excluded as much as possible. The term "linear open-loop characteristic" refers to a characteristic of a gain characteristic and a phase characteristic of the radio frequency amplifier relative to output power at a working voltage determined for a load (an examination subject).

In step 702, modifying the lookup table based on the linear open-loop characteristic to form the real-time optimized lookup table.

In some embodiments, a lookup table is selected from the preset lookup table and the real-time optimized lookup table based on an application scenario of the magnetic resonance imaging system, so as to perform linear compensation value. The application scenario includes a type of a hospital, that is, the linear compensation method 600 shown in FIG. 11 or the linear compensation method 700 shown in FIG. 12 may be selected based on the type of the hospital. Specifically, for an orthopedic hospital, a frequently scanned part is a bone, or for a children's hospital, a frequently scanned subject is a child. For this specific scanning requirement, a load change is generally not too large, and linear compensation may be performed by using the preset fixed lookup table. However, for a general hospital, both adults and children are scanned, and various parts need to be scanned. Therefore, linear compensation may be performed by using the real-time optimized lookup table. By configuring different linear compensation methods according to the hospital type, a more suitable, convenient, and fast mode can be selected according to the user's requirements.

Figure 13:
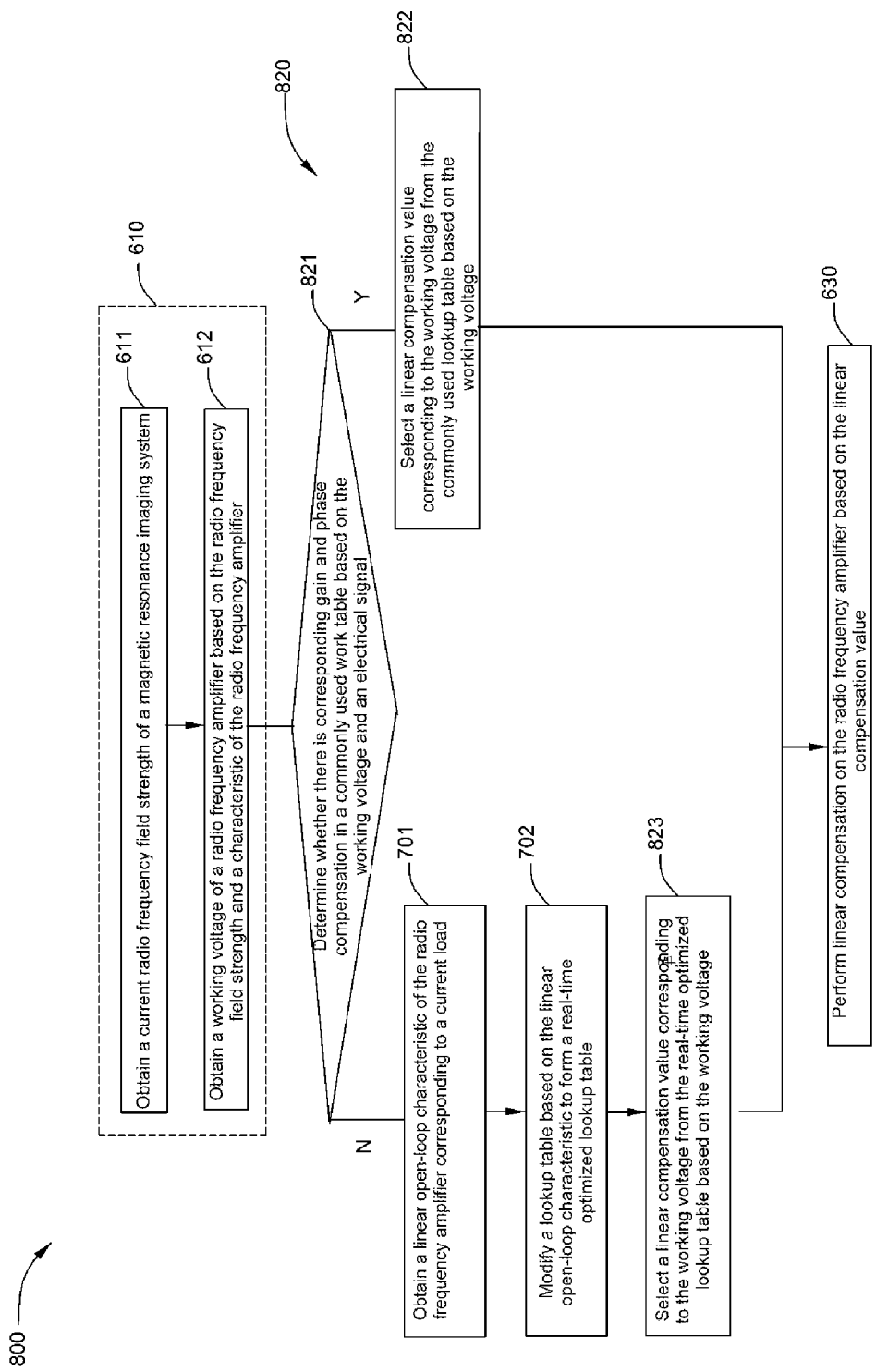
FIG. 13 is a flowchart of a linear compensation method for a radio frequency amplifier according to still some other embodiments of the present invention.

FIG. 13 shows a linear compensation method 800 for a radio frequency amplifier according to still some other embodiments of the present invention. For ease of description, step 640 (control a supply voltage of the radio frequency amplifier based on the working voltage) is omitted in FIG. 13. This does not mean that this step is not included in the linear compensation method shown in FIG. 13. Unlike the linear compensation method 700 shown in FIG. 12, in step 820 of the linear compensation method 800, the selecting a linear compensation value corresponding to the working voltage from a lookup table based on the working voltage includes selecting the linear compensation value from the real-time optimized lookup table or the commonly used lookup table based on whether the working voltage and the radio frequency field strength have a corresponding linear compensation value in the commonly used lookup table.

In some embodiments, step 820 includes step 821, step 822, and step 823.

In step 821, determining, based on the working voltage and the radio frequency field strength, whether there are corresponding gain compensation and phase compensation in the commonly used lookup table. Specifically, based on the current radio frequency field strength and the working voltage, the commonly used lookup table is searched (or traversed) for a matching record (gain compensation and phase compensation), that is, whether the current load is in the commonly used scan ranking needs to be determined. If it is determined that there is a corresponding record in the commonly used lookup table, proceed to step 822. If there is no record, proceed to step 823.

Real-time optimized lookup tables used for a plurality of scans within a predetermined time period are sorted, and at least one lookup table is selected based on the sorting result as the commonly used lookup table. The sorting may be performed based on use frequency. For example, use counts of lookup tables used in all scans within three months may be sorted, and the top 10 lookup tables in the sorting may be selected to obtain a commonly used lookup table. The commonly used lookup table includes a radio frequency field strength B1, a working voltage of a corresponding radio frequency amplifier, and corresponding gain and phase compensation. In some embodiments, the real-time optimized lookup tables may be sorted based on deep learning (or artificial intelligence).

In step 822, selecting a linear compensation value corresponding to the working voltage from the commonly used lookup table based on the working voltage.

In step 823, selecting a linear compensation value corresponding to the working voltage from the real-time optimized lookup table based on the working voltage.

In other words, if the radio frequency field strength B1 and the working voltage based on a current scan have a corresponding linear compensation value in the commonly used lookup table, the linear compensation value is selected from the commonly used lookup table, and if not, the linear compensation value is selected from the real-time optimized lookup table.

In summary, the linear compensation methods for the radio frequency amplifier in some embodiments of the present invention include a plurality of linear compensation methods. The first method is to perform linear compensation based on the preset lookup table, the second method is to perform linear compensation based on the real-time optimized lookup table, and the third method is to perform linear compensation based on the commonly used lookup table. In addition, switching may be performed between the first and the second methods based on a type of a hospital, and switching may be performed between the second and the third methods based on whether a current load is a common load. To ensure both linearity and efficiency, a user can select an appropriate mode to perform linear compensation according to a requirement, so as to obtain an ideal effect.

Switching may be performed between the first and second methods based on a type of a hospital, so that different linear compensation methods can be switched for different scanning requirements of a general hospital and a specialized hospital (for example, an orthopedic hospital or a children's hospital). Linear compensation can be performed more accurately for variable loads of the general hospital, and for a basically specific load, the process can be simplified and the storage space may be reduced, and compensation is performed more quickly and conveniently.

By setting the commonly used lookup table, the procedure can be simplified, so that for a common radio frequency field strength B1 and a working voltage that are corresponding to a common load, a training pulse does not need to be transmitted each time at the automatic pre-scanning stage to optimize a record table; in addition, compared with the preset lookup table, a function of intelligently selecting a lookup table is enabled, and more intelligent and more accurate compensation can be performed.

The present invention may further provide a non-transitory computer-readable storage medium, for storing an instruction set and/or a computer program. When executed by a computer, the instruction set and/or computer program causes the computer to perform the aforementioned method for obtaining a predicted image of a truncated portion. The computer executing the instruction set and/or computer program may be a computer of an MRI system, or may be other devices/modules of the MRI system. In one embodiment, the instruction set and/or computer program may be programmed in a processor/controller of the computer.

Specifically, when executed by the computer, the instruction set and/or computer program causes the computer to:
determine a working voltage of a radio frequency amplifier;
determine a corresponding linear compensation value based on the working voltage; and
perform linear compensation on the radio frequency amplifier based on the linear compensation value.

The instructions described above may be combined into one instruction for execution, and any of the instructions may also be split into a plurality of instructions for execution. Moreover, the present invention is not limited to the instruction execution order described above.

As used herein, the term "computer" may include any processor-based or microprocessor-based system including a system that uses a microcontroller, a reduced instruction set computer (RISC), an application specific integrated circuit (ASIC), a logic circuit, and any other circuit or processor capable of executing the functions described herein. The above examples are merely exemplary and thus are not intended to limit the definition and/or meaning of the term "computer" in any way.

The instruction set may include various commands that instruct a computer acting as a processor or instruct a processor to perform particular operations, such as the methods and processes of various embodiments. The instruction set may be in the form of a software program, and the software program can form part of one or a plurality of tangible, non-transitory computer-readable media. The software may be in various forms such as system software or application software. In addition, the software may be in the form of a set of independent programs or modules, a program module within a larger program, or part of a program module. The software may also include modular programming in the form of object-oriented programming. The input data may be processed by the processor in response to an operator command, or in response to a previous processing result, or in response to a request made by another processor.

Some exemplary embodiments have been described above; however, it should be understood that various modifications can be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A linear compensation method for a radio frequency amplifier of a magnetic resonance imaging system, comprising:
    determining a working voltage of the radio frequency amplifier;
    determining a corresponding linear compensation value based on the working voltage; and
    performing linear compensation on the radio frequency amplifier based on the linear compensation value.

2. The linear compensation method according to claim 1, wherein the determining a working voltage of the radio frequency amplifier comprises:
    obtaining a current radio frequency field strength of the magnetic resonance imaging system; and
    obtaining the working voltage of the radio frequency amplifier based on the radio frequency field strength and a characteristic of the radio frequency amplifier.

3. The linear compensation method according to claim 2, wherein the characteristic of the radio frequency amplifier comprises a characteristic in which at least one of a gain, phase, and efficiency of the radio frequency amplifier changes with an output power.

4. The linear compensation method according to claim 2, wherein the obtaining a current radio frequency field strength of the magnetic resonance imaging system comprises estimating the radio frequency field strength based on a set scanning parameter.

5. The linear compensation method according to claim 1, further comprising:
    controlling a supply voltage of the radio frequency amplifier based on the working voltage.

6. The linear compensation method according to claim 1, wherein the determining a corresponding linear compensation value based on the working voltage comprises selecting a linear compensation value corresponding to the working voltage from a lookup table based on the working voltage.

7. The linear compensation method according to claim 6, wherein the selecting a linear compensation value corresponding to the working voltage from a lookup table comprises selecting the linear compensation value from a preset lookup table corresponding to a constant load.

8. The linear compensation method according to claim 7, wherein the determining a corresponding linear compensation value based on the working voltage further comprises optimizing the preset lookup table to form a real-time optimized lookup table corresponding to a real-time load, and the selecting a linear compensation value corresponding to the working voltage from a lookup table comprises selecting the linear compensation value from the real-time optimized lookup table.

9. The linear compensation method according to claim 8, wherein the determining a corresponding linear compensation value based on the working voltage further comprises selecting a lookup table from the preset lookup table and the real-time optimized lookup table based on an application scenario of the magnetic resonance imaging system, so as to perform linear compensation value.

10. The linear compensation method according to claim 8, wherein the optimizing the preset lookup table comprises:
    obtaining a linear open-loop characteristic of the radio frequency amplifier corresponding to a current load; and
    modifying the preset lookup table based on the linear open-loop characteristic to form the real-time optimized lookup table.

11. The linear compensation method according to claim 10, wherein the linear open-loop characteristic comprises being obtained based on a training pulse inputted to the radio frequency amplifier.

12. The linear compensation method according to claim 8, wherein the determining a corresponding linear compensation value based on the working voltage further comprises sorting the real-time optimized lookup tables used for a plurality of scans within a predetermined time period and selecting at least one lookup table based on the sorting result as a commonly used lookup table.

13. The linear compensation method according to claim 12, wherein the selecting a linear compensation value corresponding to the working voltage from a lookup table comprises selecting the linear compensation value from the real-time optimized lookup table or the commonly used lookup table based on whether the working voltage and the radio frequency field strength have a corresponding linear compensation value in the commonly used lookup table.

14. The linear compensation method according to claim 13, wherein if the radio frequency field strength and the working voltage based on a current scan have a corresponding linear compensation value in the commonly used lookup table, the linear compensation value is selected from the commonly used lookup table, and if not, the linear compensation value is selected from the real-time optimized lookup table.

15. A non-transitory computer-readable storage medium for storing a computer program, wherein when executed by a computer, the computer program causes a computer to perform the linear compensation method according to claim 1.

16. A magnetic resonance imaging system, comprising the linear compensation apparatus according to claim 15.

17. The magnetic resonance imaging system of claim 16, further comprising:
a power supply control board of a radio frequency amplifier, configured to control a supply voltage of the radio frequency amplifier based on the working voltage.

18. A linear compensation apparatus of a magnetic resonance imaging system, comprising:
a control module, configured to determine a working voltage of a radio frequency amplifier;
a lookup module, configured to determine a corresponding linear compensation value based on the working voltage; and
a compensation module, configured to perform linear compensation on the radio frequency amplifier based on the linear compensation value.

19. The linear compensation apparatus according to claim 18, wherein the control module is further configured to obtain the working voltage of the radio frequency amplifier based on an obtained current radio frequency field strength of the magnetic resonance imaging system and a characteristic of the radio frequency amplifier.

20. The linear compensation apparatus according to claim 19, wherein the control module is further configured to estimate the radio frequency field strength based on a set scanning parameter.

21. The linear compensation apparatus according to claim 18, wherein the lookup module is further configured to select a linear compensation value corresponding to the working voltage from a lookup table based on the working voltage.

22. The linear compensation apparatus according to claim 21, wherein the lookup table comprises a preset lookup table corresponding to a constant load.

23. The linear compensation apparatus according to claim 22, wherein the lookup table comprises a real-time optimized lookup table corresponding to a real-time load.

24. The linear compensation apparatus according to claim 23, wherein the lookup module selects a lookup table from the preset lookup table and the real-time optimized lookup table based on an application scenario, so as to perform linear compensation.

25. The linear compensation apparatus according to claim 22, wherein the linear compensation apparatus further comprises an optimization module, and the optimization module is configured for:
obtaining a linear open-loop characteristic of the radio frequency amplifier corresponding to a current load; and
modifying the preset lookup table based on the linear open-loop characteristic to form the real-time optimized lookup table.

26. The linear compensation apparatus according to claim 25, wherein the linear open-loop characteristic comprises being obtained based on a training pulse inputted to the radio frequency amplifier.

27. The linear compensation apparatus according to claim 22, wherein the lookup table comprises a commonly used lookup table.

28. The linear compensation apparatus according to claim 27, wherein the linear compensation apparatus further comprises a learning module, and the learning module is configured to sort the real-time optimized lookup tables used for a plurality of scans within a predetermined time period and select at least one lookup table based on the sorting result as the commonly used lookup table.

29. The linear compensation apparatus according to claim 27, wherein the control module is further configured to select the linear compensation value from the real-time optimized lookup table or the commonly used lookup table based on whether the working voltage and the radio frequency field strength have a corresponding linear compensation value in the commonly used lookup table.

* * * * *